US010199503B2

(12) United States Patent
Bergendahl et al.

(10) Patent No.: US 10,199,503 B2
(45) Date of Patent: Feb. 5, 2019

(54) UNDER-CHANNEL GATE TRANSISTORS

(71) Applicant: INTERNATIONAL BUSINESS MACHINES CORPORATION, Armonk, NY (US)

(72) Inventors: Marc A. Bergendahl, Troy, NY (US); Kangguo Cheng, Schenectady, NY (US); Gauri Karve, Cohoes, NY (US); Fee Li Lie, Albany, NY (US); Eric R. Miller, Schenectady, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/495,237

(22) Filed: Apr. 24, 2017

(65) Prior Publication Data
US 2018/0308978 A1  Oct. 25, 2018

(51) Int. Cl.
*H01L 29/78* (2006.01)
*H01L 21/28* (2006.01)
*H01L 29/423* (2006.01)
*H01L 29/06* (2006.01)
*H01L 29/66* (2006.01)
*H01L 21/8234* (2006.01)

(52) U.S. Cl.
CPC .... *H01L 29/7856* (2013.01); *H01L 21/28026* (2013.01); *H01L 21/28114* (2013.01); *H01L 21/823475* (2013.01); *H01L 29/0673* (2013.01); *H01L 29/4232* (2013.01); *H01L 29/42392* (2013.01); *H01L 29/6681* (2013.01); *H01L 29/66545* (2013.01); *H01L 29/7853* (2013.01)

(58) Field of Classification Search
CPC ....... H01L 21/28026; H01L 21/823475; H01L 21/28114
See application file for complete search history.

(56) References Cited

U.S. PATENT DOCUMENTS

| | | |
|---|---|---|
| 6,800,885 B1 | 10/2004 | An et al. |
| 6,844,238 B2 | 1/2005 | Yeo et al. |
| 8,445,334 B1 | 5/2013 | Basker et al. |
| 8,552,477 B2 | 10/2013 | Zhu |
| 8,609,480 B2 | 12/2013 | Xie |
| 8,637,930 B2 | 1/2014 | Ando et al. |
| 8,900,936 B2 | 12/2014 | Kulkarni et al. |
| 9,349,658 B1 | 5/2016 | Jacob et al. |
| 9,349,868 B1 | 5/2016 | Balakrishnan et al. |
| 9,419,102 B1* | 8/2016 | Leobandung ....... H01L 29/6656 |
| 2006/0172497 A1* | 8/2006 | Hareland .......... H01L 29/42384 438/286 |

(Continued)

*Primary Examiner* — Fei Fei Yeung Lopez
(74) *Attorney, Agent, or Firm* — Tutunjian & Bitetto, P.C.; Vazken Alexanian

(57) ABSTRACT

Transistors and methods of forming the same include forming a semiconductor fin from a first material on dielectric layer. Material is etched away from the dielectric layer directly underneath a channel region of the semiconductor fin, with the semiconductor fin still being supported by the dielectric layer in a source and drain region. A gate stack is formed around the channel region of the semiconductor fin, with a portion of the gate stack underneath the semiconductor fin being larger than a portion of the gate stack above the semiconductor fin.

20 Claims, 7 Drawing Sheets

(56) References Cited

U.S. PATENT DOCUMENTS

| | | | |
|---|---|---|---|
| 2007/0158700 A1* | 7/2007 | Koh | H01L 29/66795 |
| | | | 257/288 |
| 2008/0128797 A1 | 6/2008 | Dyer et al. | |
| 2009/0191679 A1* | 7/2009 | Ouyang | H01L 21/823807 |
| | | | 438/276 |
| 2014/0175554 A1 | 6/2014 | Loubet et al. | |
| 2015/0262812 A1* | 9/2015 | Liu | H01L 21/0274 |
| | | | 438/587 |
| 2015/0287776 A1* | 10/2015 | Leobandung | H01L 29/42392 |
| | | | 257/347 |
| 2016/0218206 A1 | 7/2016 | Leobandung | |

* cited by examiner

UNDER-CHANNEL GATE TRANSISTORS

BACKGROUND

Technical Field

The present invention generally relates to transistor fabrication and, more particularly, to the fabrication of fin-based transistors with a gate structure that is at least partially below the fins.

Description of the Related Art

Fin field effect transistors (FinFETs) are semiconductor devices that use fins of semiconductor material as a channel. These devices are becoming increasingly prevalent as feature sizes continue to decrease. However, three-dimensional transistor architectures such as FinFETs can increase the parasitic capacitance between the gate structure and conductive contacts to the device. Furthermore, providing a metal gate above the fin leads to patterning challenges in the formation of the gate, as well as in the formation of spacers and the epitaxial growth of device features.

SUMMARY

A method for forming a transistor includes forming a semiconductor fin from a first material on dielectric layer. Material is etched away from the dielectric layer directly underneath a channel region of the semiconductor fin, with the semiconductor fin still being supported by the dielectric layer in a source and drain region. A gate stack is formed around the channel region of the semiconductor fin, with a portion of the gate stack underneath the semiconductor fin being larger than a portion of the gate stack above the semiconductor fin.

A method for forming a transistor includes forming a semiconductor fin from a first material on dielectric layer. A dummy gate fin is formed over the semiconductor fin, the dummy gate having a long dimension that is perpendicular to a long dimension of the semiconductor fin. Dielectric sidewalls are formed on the dummy gate fin. The dummy gate fin is etched away after forming the dielectric sidewalls to expose the channel region of the semiconductor fin. Material is etched away from the dielectric layer directly underneath a channel region of the semiconductor fin, with the semiconductor fin still being supported by the dielectric layer in a source and drain region. A gate stack is formed around the channel region of the semiconductor fin, with a portion of the gate stack underneath the semiconductor fin being larger than a portion of the gate stack above the semiconductor fin.

A semiconductor device includes a dielectric layer. A semiconductor fin is supported by a dielectric layer in a source and drain region. A gate stack is formed on a channel region of the semiconductor fin. The gate stack is formed in contact with an entire circumference of the semiconductor fin. A portion of the gate stack underneath the semiconductor fin is larger than a portion of the gate stack above the semiconductor fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide fin field effect transistors (FinFETs) structures where the bulk of the gate structure is located below the fins of the FinFETs. In particular, after formation of source/drain regions, a region of dielectric material on which the semiconductor fins are formed is etched away, creating cavities underneath the fins. These cavities are then filled with gate material, such that the gate is in contact with all sides of the fins and such the gate structure extended farther below the fins than it extends above the fins.

Figure 1:
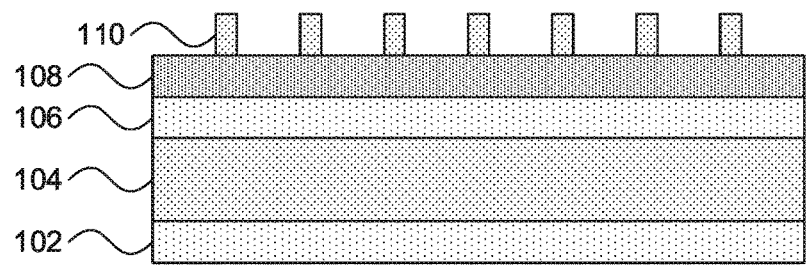
FIG. 1 is a cross-sectional diagram of a step in the formation of a transistor having an under-channel gate in accordance with an embodiment of the present invention.

Referring now to the drawings in which like numerals represent the same or similar elements and initially to FIG. 1, a cross-sectional view of a step in the formation of a transistor is shown. A set of fins 110 is formed on a hardmask layer 108 which, in turn, is formed on a stack of semiconductor layer 106, dielectric layer 104, and semiconductor substrate 102. It should be understood that any number of fins 110 may be formed closely together, corresponding to a number of channels that will be shared by a single gate.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It is specifically contemplated that the dielectric layer 104 is formed from, e.g., silicon dioxide, but it should be understood that any appropriate dielectric material may be used instead. The semiconductor layer 106 may be formed from the same semiconductor material as the semiconductor substrate 102 or may, alternatively, be formed from a different semiconductor material. It should be understood that the semiconductor layer 106 will form the fins on which the FinFET is based, so the material for the semiconductor layer 106 should be selected to match the desired properties of the final device.

It is specifically contemplated that the hardmask layer 108 may be formed from, e.g., silicon nitride, but it should be understood that any appropriate dielectric material may be used instead as long as it has etch selectivity with the fins 110. As used herein, the term "selective" in reference to a material removal process denotes that the rate of material removal for a first material is greater than the rate of removal for at least another material of the structure to which the material removal process is being applied. The fins 110 may be formed from silicon dioxide or any other appropriate material.

It is specifically contemplated that the fins 110 may be formed using a sidewall image transfer process, where mandrels are formed (for example, at a lithographic etch limit) and a layer of material is conformally deposited over the mandrels. The material may be etched back and the mandrels may then be removed, leaving only the sidewall fins at a thickness that may be significantly below the lithographic limit. However, alternative processes may be employed to form the fins 110 including, e.g., an anisotropic etch such as reactive ion etching (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
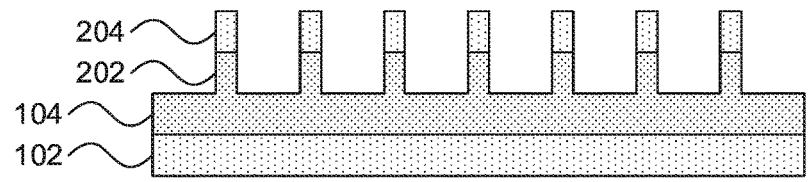
FIG. 2 is a cross-sectional diagram of a step in the formation of a transistor having an under-channel gate in accordance with an embodiment of the present invention.

Referring now to FIG. 2, a cross-sectional view of a cross-sectional view of a step in the formation of a transistor is shown. Using the fins 110 as a mask, the hardmask layer 108 is etched into fins, which are in turn used to etch down into the semiconductor layer 106 and partially into the dielectric layer 104. After etching away the hardmask layer 108, semiconductor fins 204 remain supported by fins 202 of the dielectric layer 104. Any appropriate anisotropic etch or combination of etches, as set forth above, may be used to form these structures, with the final etch being controlled so as to prevent the dielectric layer 104 from being cut through.

Figure 3:
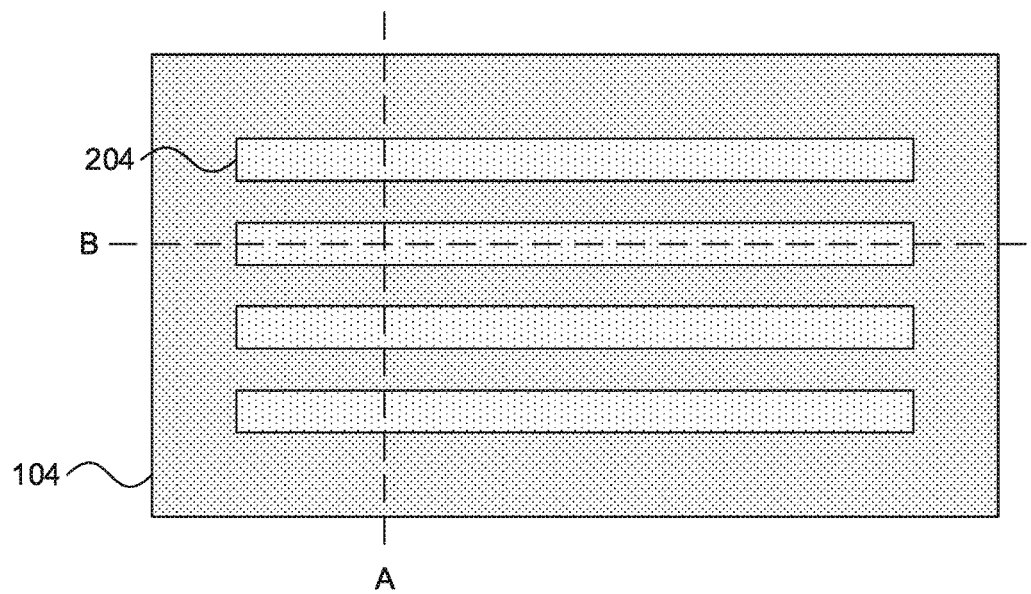
FIG. 3 is a top-down diagram of a step in the formation of a transistor having an under-channel gate in accordance with an embodiment of the present invention.

Referring now to FIG. 3, a top-down view of a step in the formation of a transistor is shown. This view shows the semiconductor fins 204 and provides two cross-sections, A and B. These cross-sections will be used going forward to illustrate different views of certain steps. FIG. 1 and FIG. 2, discussed above, are both shown along cross-section A.

Figure 4:
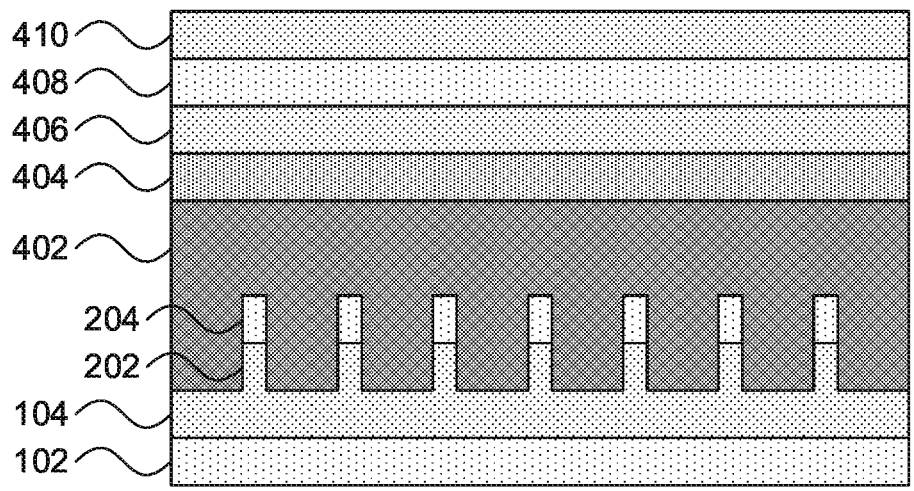
FIG. 4 is a cross-sectional diagram of a step in the formation of a transistor having an under-channel gate in accordance with an embodiment of the present invention.

Referring now to FIG. 4, a cross-sectional view along cross-section A of a step in the formation of a transistor is shown. A dummy gate layer 402 is formed over the semiconductor fins 204 from an appropriate dummy gate material such as, e.g., amorphous silicon. A layer of hardmask material 404 is formed on the dummy gate layer 402 and may be formed from any appropriate material such as, e.g., silicon nitride. The dummy gate layer 402 and the hardmask layer 404 together form what will become dummy gate stacks.

A layer of dielectric material 406 is formed over the layer of hardmask material 404 and may be formed from, e.g., silicon dioxide. A layer of semiconductor material 408 (such as, e.g., amorphous silicon) is then formed on the dielectric layer 406, followed by fins 410, which have a longitudinal axis that is perpendicular to a longitudinal axis of the semiconductor fins 204. It is specifically contemplated that the fins 410 may be formed from, e.g., silicon dioxide and may be formed from any appropriate process, including sidewall image transfer or lithographic etching.

Figure 5:
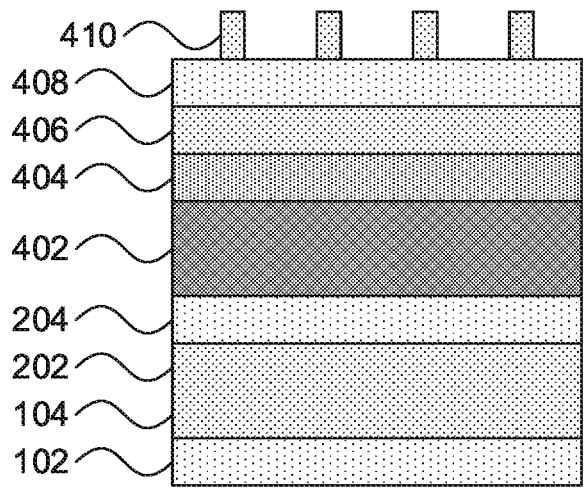
FIG. 5 is a cross-sectional diagram of a step in the formation of a transistor having an under-channel gate in accordance with an embodiment of the present invention.

Referring now to FIG. 5, a cross-sectional view along cross-section B of a step in the formation of a transistor is shown. In particular, this view illustrates the fins 410 in cross-section. The spacing of the fins 410 may be formed at or below the lithographic processing limit, depending on the fabrication process used.

Figure 6:
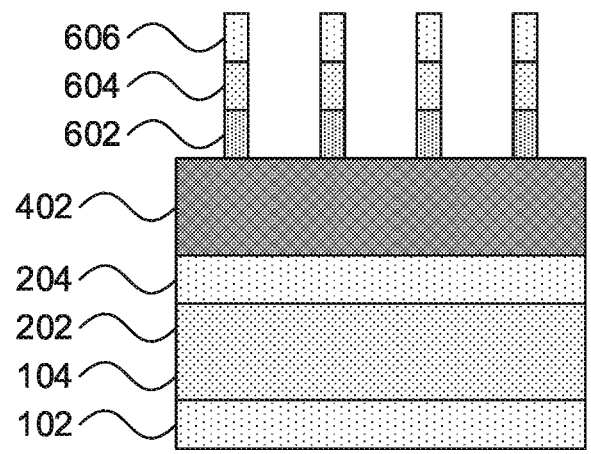
FIG. 6 is a cross-sectional diagram of a step in the formation of a transistor having an under-channel gate in accordance with an embodiment of the present invention.

Referring now to FIG. 6, a cross-sectional view along cross-section A of a step in the formation of a transistor is shown. The fins 410 are used as a mask for etching the layers underneath. An anisotropic etch, such as RIE, may be used to form stacked hardmask fins 602, dielectric fins 604, and semiconductor fins 606. The underlying dummy gate layer 402 is exposed by these etches, without being substantially damaged by said etches.

Figure 7:
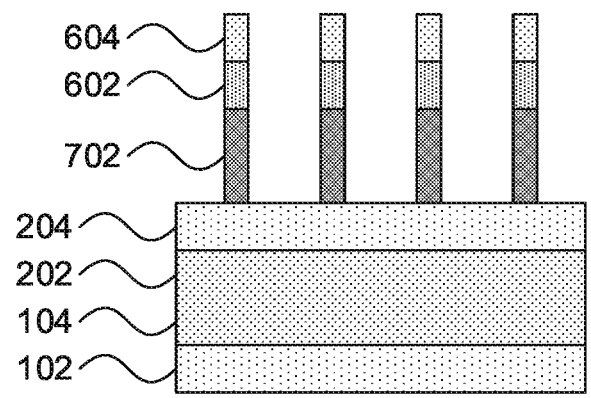
FIG. 7 is a cross-sectional diagram of a step in the formation of a transistor having an under-channel gate in accordance with an embodiment of the present invention.

Referring now to FIG. 7, a cross-sectional view along cross-section B of a step in the formation of a transistor is shown. The dummy gate layer 402 is etched down, using the stack of fins as a mask, to form dummy gate fins 702. The underlying semiconductor fins 204 may be protected from this etch by, e.g., a thin oxide layer.

Figure 8:
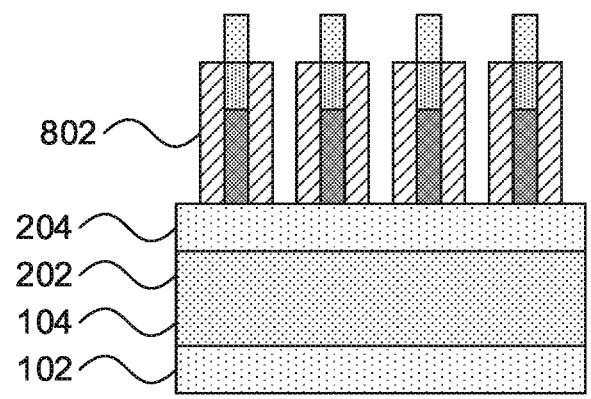
FIG. 8 is a cross-sectional diagram of a step in the formation of a transistor having an under-channel gate in accordance with an embodiment of the present invention.

Referring now to FIG. 8, a cross-sectional view along cross-section B of a step in the formation of a transistor is shown. Sidewalls 802 are formed on the dummy gate fins 702. The sidewalls 802 may be formed by, e.g., conformally depositing a dielectric material, such as silicoboron carbonitride (SiCBN), on all exposed surfaces using an appropriate deposition process. Although SiCBN is specifically contemplated, other materials may be used instead if they have appropriate etch selectivity. After deposition, the conformal layer is anisotropically etched, removing material from horizontal surfaces. This leaves material only on the vertical surfaces of the dummy gate stack.

The sidewalls 802 may be formed by any appropriate process including, e.g., chemical vapor deposition (CVD), physical vapor deposition (PVD), or atomic layer deposition (ALD). CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 9:
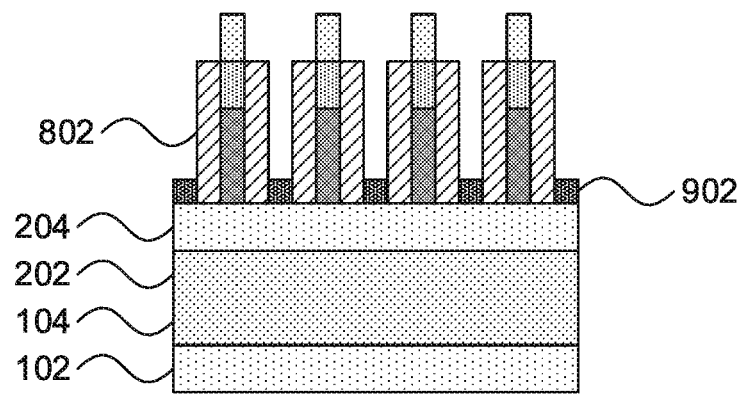
FIG. 9 is a cross-sectional diagram of a step in the formation of a transistor having an under-channel gate in accordance with an embodiment of the present invention.

Referring now to FIG. 9, a cross-sectional view along cross-section B of a step in the formation of a transistor is shown. Source/drain extensions 902 are epitaxially grown from the semiconductor fins 204 to form source/drain regions. It is specifically contemplated that the source/drain extensions 902 may be epitaxially grown using a material that is crystallographically compatible with the material of the semiconductor fins 204. The source/drain extensions 902 may be doped in situ during epitaxial growth or may, alternatively, be doped by dopant implantation. The source/drain regions of the semiconductor fins 204 may similarly be doped by implantation. The dopant used will reflect the type of device, p-type or n-type, that is being formed.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The dopant of the source/drain regions and the source/drain extension 902 reflects the type of device being formed. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 10:
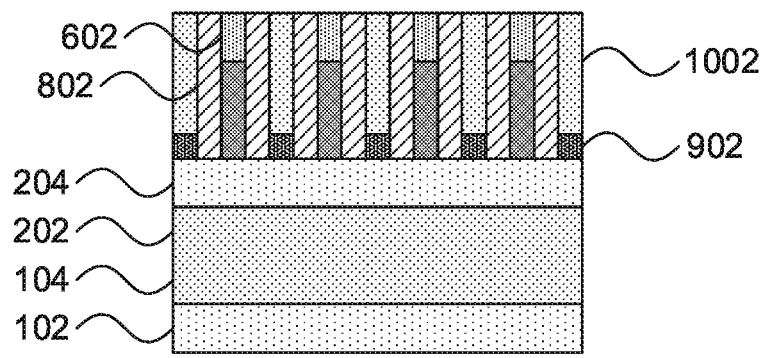
FIG. 10 is a cross-sectional diagram of a step in the formation of a transistor having an under-channel gate in accordance with an embodiment of the present invention.

Referring now to FIG. 10, a cross-sectional view along cross-section B of a step in the formation of a transistor is shown. A dielectric material is filled in, filling spaces between the dummy gate stacks and covering the source/drain extensions 902. The dielectric material is then polished down to the level of the hardmask 602 using, e.g., chemical mechanical planarization (CMP).

The dielectric material may be deposited by any appropriate process including, e.g., CVD, PVD, ALD, or a spin-on process using a flowable dielectric material. The dielectric material is specifically contemplated as being a flowable silicon dioxide. CMP is performed using, e.g., a chemical or granular slurry and mechanical force to gradually remove upper layers of the device. The slurry may be formulated to be unable to dissolve, for example, the hardmask material, resulting in the CMP process's inability to proceed any farther than that layer.

Figure 11:
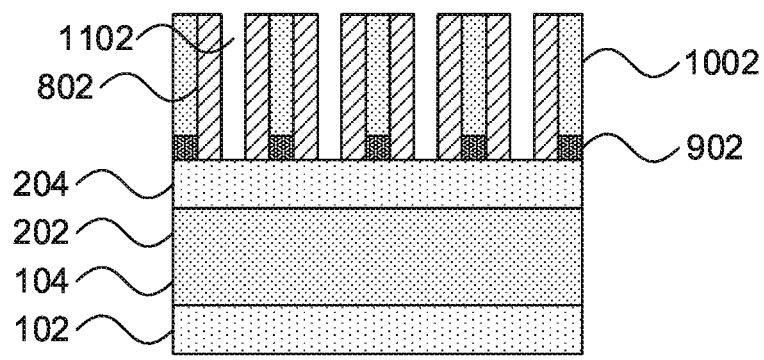
FIG. 11 is a cross-sectional diagram of a step in the formation of a transistor having an under-channel gate in accordance with an embodiment of the present invention.

Referring now to FIG. 11, a cross-sectional view along cross-section B of a step in the formation of a transistor is shown. The dummy gate stack is etched away, removing the dummy gate hardmask 602 and the dummy gate fins 702. This may be performed in a single etch or as separate selective etches. The etch exposes the underlying semiconductor fins 204.

Figure 12:
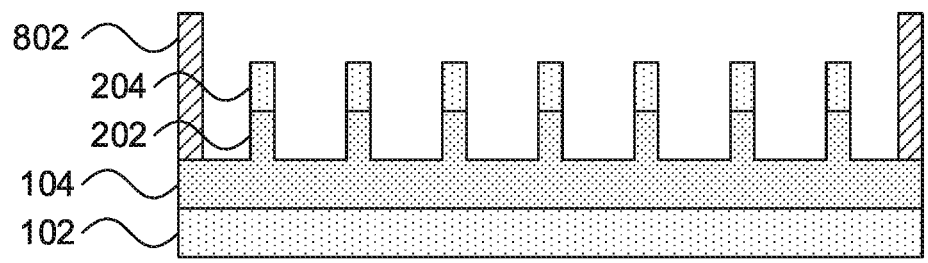
FIG. 12 is a cross-sectional diagram of a step in the formation of a transistor having an under-channel gate in accordance with an embodiment of the present invention.

Referring now to FIG. 12, a cross-sectional view along cross-section A of a step in the formation of a transistor is shown. This view illustrates the exposed semiconductor fins 204 in cross section, with sidewalls 802 bounding a gate area.

Figure 13:
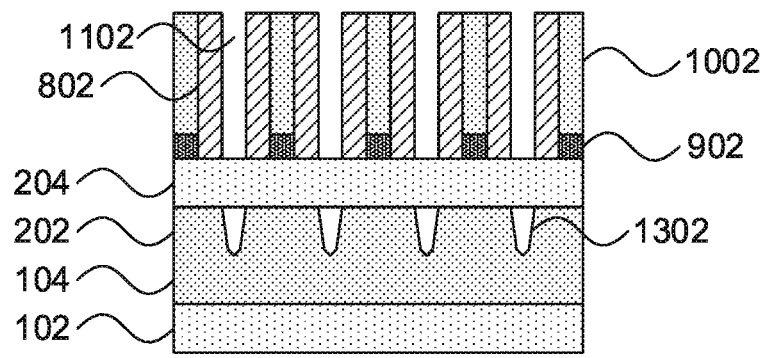
FIG. 13 is a cross-sectional diagram of a step in the formation of a transistor having an under-channel gate in accordance with an embodiment of the present invention.

Referring now to FIG. 13, a cross-sectional view along cross-section B of a step in the formation of a transistor is shown. An isotropic etch of the dielectric material 202 is performed, etching down underneath the semiconductor fins 204. Any appropriate selective wet or dry chemical etch may be employed to perform this etch, leaving cavities 1302 under the semiconductor fins 204.

Figure 14:
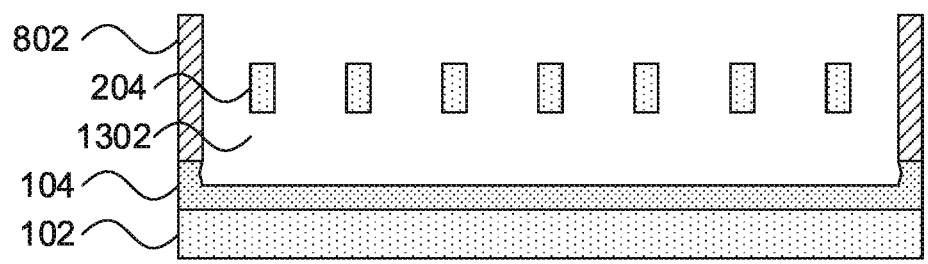
FIG. 14 is a cross-sectional diagram of a step in the formation of a transistor having an under-channel gate in accordance with an embodiment of the present invention.

Referring now to FIG. 14, a cross-sectional view along cross-section A of a step in the formation of a transistor is shown. A cavity 1302 is more clearly shown as being positioned beneath all of the semiconductor fins 204. As can be seen in the figure, the isotropic etch that forms cavity 1302 may undercut the sidewalls 802 to a small degree. The cavity 1302 will be filled in subsequent steps, so this undercut will not affect the stability of structures in the final device.

Figure 15:
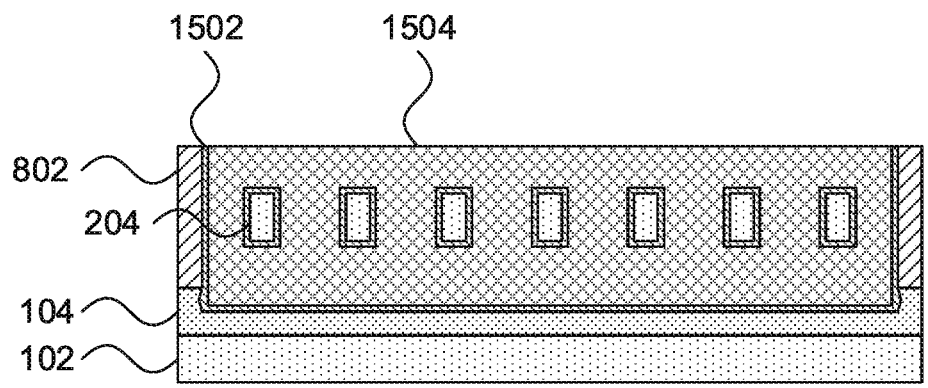
FIG. 15 is a cross-sectional diagram of a step in the formation of a transistor having an under-channel gate in accordance with an embodiment of the present invention.

Referring now to FIG. 15, a cross-sectional view along cross-section A of a step in the formation of a transistor is shown. As noted above, a thin layer of dielectric material, such as an oxide (not shown), may be formed on the semiconductor fins 204 and may act as a gate dielectric. A gate stack is formed in the cavity 1302 around the semiconductor fins 204. In particular, a work function metal layer 1502 is conformally deposited on exposed surfaces of the semiconductor fins 204, the underlying dielectric layer 104, and the sidewalls 802 by any appropriate deposition process including, e.g., CVD, PVD, or ALD. A gate 1504 is then formed with a gate conductor material being deposited over the work function metal layer 1502. The gate conductor material is deposited to a height above the sidewalls 802 and is then polished down, stopping on the hardmask material of the sidewalls 802. Because of the slight undercut of the cavity 1302 beneath the sidewalls 802, at least a portion of the gate stack may be formed underneath the sidewalls 802.

The work function metal layer 1502 provides a shift in the threshold voltage of the finished device and may include a p-type work function metal or an n-type work function metal, the former being used to shift the Fermi energy of a p-type semiconductor device toward a valence band of the semiconductor fins 204 and the latter being used to shift the Fermi energy of an n-type semiconductor device toward a conduction band in the semiconductor fins 204.

The gate 1504 may comprise conductive materials including, e.g., tungsten, nickel, titanium, molybdenum, tantalum, copper, platinum, silver, gold, ruthenium, rhenium, iridium, and alloys that include at least one of the aforementioned conductive elemental metals. In alternative embodiments, the gate 1504 may include a doped semiconductor material such as, e.g., doped polysilicon. When a combination of conductive elements is employed, an optional diffusion barrier material such as tantalum nitride or tungsten nitride may be formed between the conductive materials.

Figure 16:
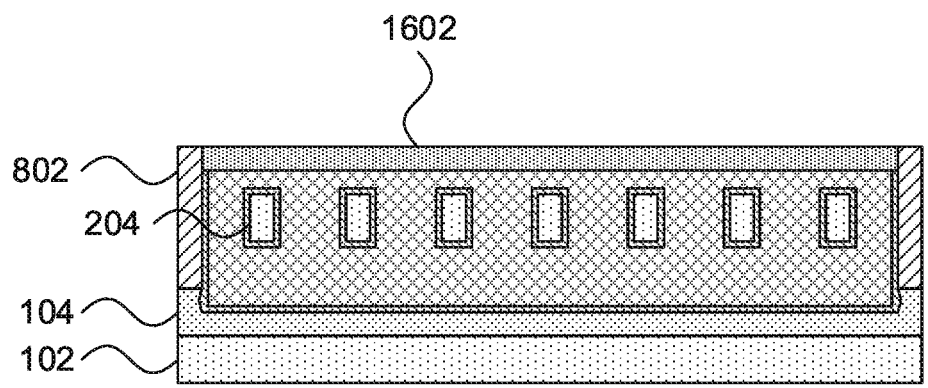
FIG. 16 is a cross-sectional diagram of a step in the formation of a transistor having an under-channel gate in accordance with an embodiment of the present invention.

Referring now to FIG. 16, a cross-sectional view along cross-section A of a step in the formation of a transistor is shown. The gate stack is recessed, with the work function metal layer 1502 and the gate 1504 being etched back using any appropriate isotropic or anisotropic etch or combination of etches. A gate cap 1602 is then formed from, e.g., silicon nitride, by any appropriate deposition process such as, e.g., CVD, ALD, or PVD followed by CMP. As can be seen, the bulk of the recessed gate 1504 is below the semiconductor fins 204.

Figure 17:
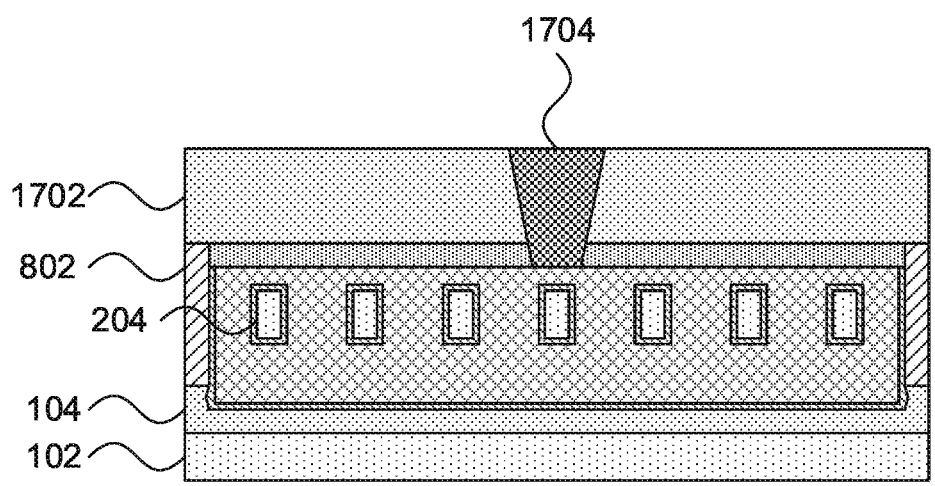
FIG. 17 is a cross-sectional diagram of a step in the formation of a transistor having an under-channel gate in accordance with an embodiment of the present invention.

Referring now to FIG. 17, a cross-sectional view along cross-section A of a step in the formation of a transistor is shown. An inter-layer dielectric 1702 is formed from, e.g., silicon dioxide, by any appropriate deposition process. A gate contact 1704 is formed through the inter-layer dielectric 1702 and the gate cap 1062 to form an electrical connection with the gate 1504.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. it will be understood that the spatially relative terms are intended to encompass different orientations of the device in use or operation in addition to the orientation depicted in the FIGS. For example, if the device in the FIGS.

is turned over, elements described as "below" "beneath" other elements or features would then be oriented "above" the other elements or features. 'Thus, the term "below"' can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 18:
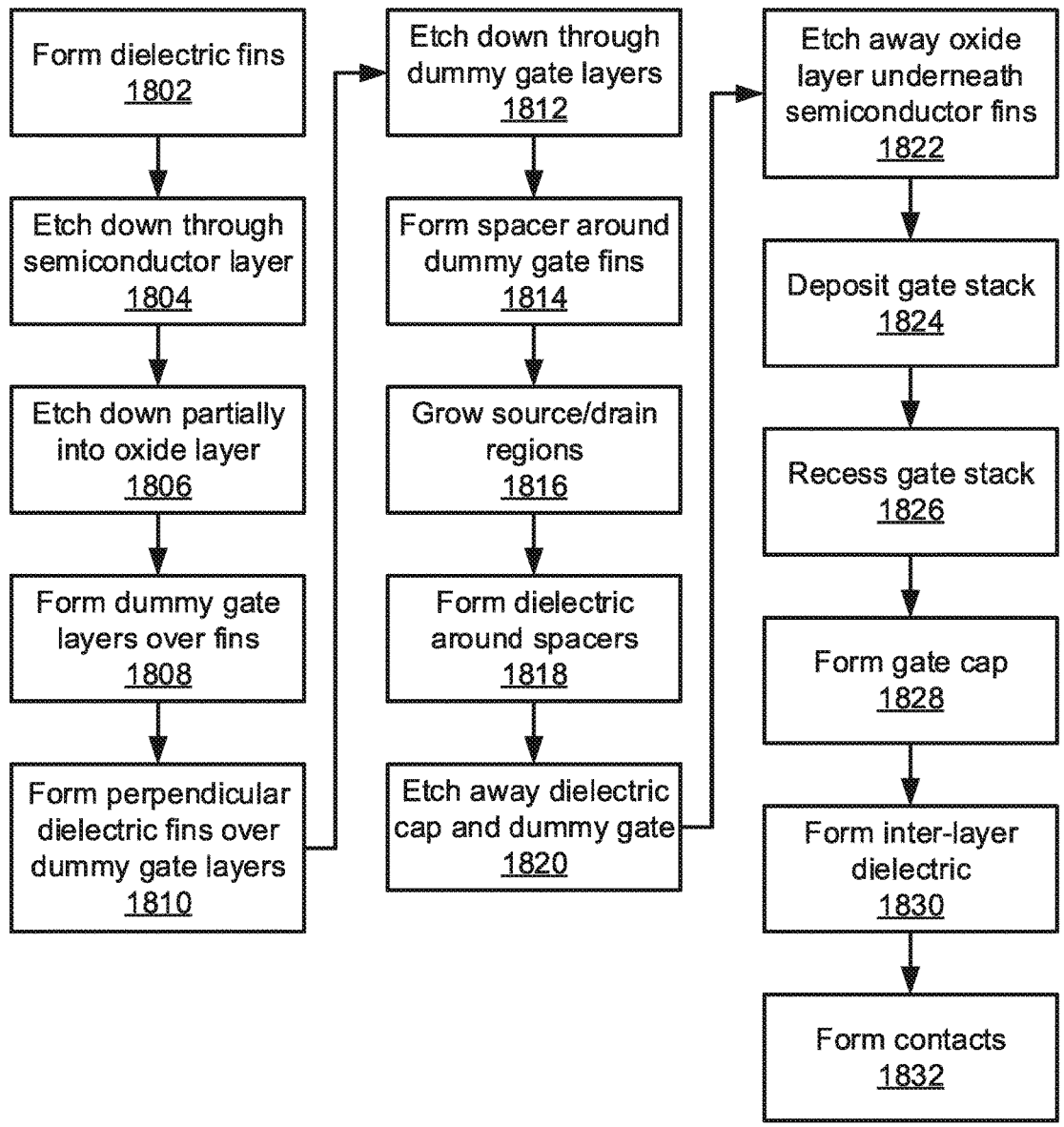
FIG. 18 is a block/flow diagram of a method of forming a transistor having an under-channel gate in accordance with an embodiment of the present invention.

Referring now to FIG. 18, a method of fabricating a transistor is shown. Block 1802 forms dielectric fins 110 on a stack of layers. As noted above, the dielectric fins 110 may be formed by sidewall image transfer or by any other appropriate process. The dielectric fins 110 may be formed by any appropriate material that has appropriate etch selectivity relative to the other layers. Block 1804 then etches down through a semiconductor layer 106 using the dielectric fins 110 as a mask to form semiconductor fins 204. Block 1806 etches part of the way through an underlying dielectric layer, forming fins 202 on a base of dielectric material.

Block 1808 forms dummy gate layers over the fins 202 and 204, with a dummy gate layer 402 being formed from, e.g., amorphous silicon, and a dummy gate cap layer 404 being formed from a hardmask material such as silicon nitride. Block 1810 forms fins 410 that are perpendicular to the semiconductor fins 204 and block 1812 etches down through the dummy gate layers to form dummy gate fins 702 and dummy gate caps 602.

Block 1814 forms spacers 802 around the dummy gate fins 702 from an appropriate hard mask material such as, e.g., SiBCN. Block 1814 forms the spacers by conformally depositing the material by any appropriate process such as, e.g., CVD, ALD, or PVD, and then anisotropically etching the material away from horizontal surfaces.

Block 1816 epitaxially grows doped source/drain regions 902 from those portions of the semiconductor fins 204 that are not covered by the spacers 802 and the dummy gate fins 702. The source/drain regions 902 may be doped in situ or by implantation. Block 1818 forms a dielectric fill 1002 around the spacers 802 by, e.g., spinning on a flowable oxide and polishing the oxide material down to the level of the dummy gate caps 602.

Block 1820 etches away the dummy gate cap 602 and the dummy gate fins 702 to expose the semiconductor fins 702 underneath. Block 1822 partially etches the oxide layer 104 under the semiconductor fins 204, removing the oxide fins 202. The semiconductor fins 204 are suspended by unetched portions of the oxide layer 104 that were still covered by the spacers 802 and the dielectric fill 1002.

Block 1824 deposits a gate stack that includes work function metal 1502 and gate conductor 1504 and polishes the gate stack down to the level of the spacers 802. Block 1826 recesses the gate stack below the height of the spacers 802 and block 1828 forms gate cap 1602 from, e.g., an appropriate dielectric material. Block 1830 forms an inter-layer dielectric 1702 over the gate cap 1602 and block 1832 forms contacts to the gate conductor 1504 and to the source/drain regions 902.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A method for forming a transistor, comprising:
    anisotropically etching a stacked semiconductor layer and dielectric layer to form a semiconductor fin from a first material on a dielectric fin;
    etching away material from the dielectric layer directly underneath a channel region of the semiconductor fin, with the semiconductor fin still being supported by the dielectric layer in a source and drain region and with a continuous remnant of the dielectric layer remaining underneath the semiconductor fin;
    forming a gate stack around the channel region of the semiconductor fin, with a portion of the gate stack underneath the semiconductor fin having a vertical thickness greater than a vertical thickness of a portion of the gate stack above the semiconductor fin.

2. The method of claim 1, further comprising forming a dummy gate fin over the semiconductor fin, the dummy gate fin having a long dimension that is perpendicular to a long dimension of the semiconductor fin.

3. The method of claim 2, further comprising forming dielectric sidewalls on the dummy gate fin.

4. The method of claim 3, further comprising etching away the dummy gate fin after forming the dielectric sidewalls to expose the channel region of the semiconductor fin.

5. The method of claim 4, wherein etching away material from the dielectric layer is performed after etching away the dummy gate.

6. The method of claim 3, further comprising forming source and drain extensions on the source and drain region of the semiconductor after forming the dielectric sidewalls.

7. The method of claim 3, wherein forming the gate stack comprises:
    conformally depositing a work function layer on the semiconductor fin, the dielectric sidewalls, and the dielectric layer;
    depositing a gate conductor on the work function layer; and
    polishing the work function layer and the gate conductor down to a height of the dielectric sidewalls.

8. The method of claim 7, further comprising:
    recessing the gate stack below the height of the dielectric sidewalls; and
    forming a dielectric gate cap over the gate stack to the height of the dielectric sidewalls.

9. The method of claim 1, further comprising:
    forming an inter-layer dielectric over the gate stack; and
    forming respective contacts through the inter-layer dielectric to the gate stack and to the source and drain region of the semiconductor fin.

10. A method for forming a transistor, comprising:
    anisotropically a stacked semiconductor layer and dielectric layer to form a semiconductor fin from a first material on a dielectric fin;

forming a dummy gate fin over the semiconductor fin, the dummy gate having a long dimension that is perpendicular to a long dimension of the semiconductor fin;

forming dielectric sidewalls on the dummy gate fin;

etching away the dummy gate fin after forming the dielectric sidewalls to expose the channel region of the semiconductor fin;

etching away material from the dielectric layer directly underneath a channel region of the semiconductor fin, with the semiconductor fin still being supported by the dielectric layer in a source and drain region and with a continuous remnant of the dielectric layer remaining underneath the semiconductor fin;

forming a gate stack around the channel region of the semiconductor fin, with a portion of the gate stack underneath the semiconductor fin having a vertical thickness greater than a vertical thickness of a portion of the gate stack above the semiconductor fin.

11. The method of claim 10, wherein etching away material from the dielectric layer is performed after etching away the dummy gate.

12. The method of claim 10, further comprising forming source and drain extensions on the source and drain region of the semiconductor after forming the dielectric sidewalls.

13. The method of claim 10, wherein forming the gate stack comprises:

conformally depositing a work function layer on the semiconductor fin, the dielectric sidewalls, and the dielectric layer;

depositing a gate conductor on the work function layer; and polishing the work function layer and the gate conductor down to a height of the dielectric sidewalls.

14. The method of claim 13, further comprising:

recessing the gate stack below the height of the dielectric sidewalls; and forming a dielectric gate cap over the gate stack to the height of the dielectric sidewalls.

15. A semiconductor device, comprising:

a dielectric layer;

a semiconductor fin supported directly by a dielectric layer in a source and drain region, wherein the dielectric layer forms a continuous layer underneath the semiconductor fin;

a gate stack comprising a gate dielectric and a gate conductor formed on a channel region of the semiconductor fin and on the dielectric layer, the gate stack being formed in contact with an entire circumference of the semiconductor fin, wherein a portion of the gate stack underneath the semiconductor fin has a vertical thickness greater than a vertical thickness of a portion of the gate stack above the semiconductor fin and wherein the gate stack is recessed below a height of sidewalls formed on the dielectric layer around the gate stack.

16. The semiconductor device of claim 15, wherein the dielectric layer is recessed in an area between the sidewalls.

17. The semiconductor device of claim 15, further comprising a dielectric gate cap on the gate stack having a top surface at a same height as the sidewalls.

18. The semiconductor device of claim 15, wherein a portion of the gate stack is formed directly underneath the dielectric sidewalls.

19. The method of claim 1, wherein no part of the gate stack penetrates the continuous remnant of the dielectric layer.

20. The semiconductor device of claim 15, wherein no part of the gate stack penetrates the continuous dielectric layer underneath the semiconductor fin.

* * * * *